United States Patent
Early et al.

(10) Patent No.: US 6,891,429 B1
(45) Date of Patent: May 10, 2005

(54) SWITCHED CAPACITOR FILTER

(75) Inventors: Adrian B. Early, Snohomish, WA (US); Harold Kutz, Snoqualmie, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 10/325,398

(22) Filed: Dec. 18, 2002

(51) Int. Cl.$^7$ ................................................ H03K 5/00
(52) U.S. Cl. ...................................... 327/554; 327/337
(58) Field of Search ........................ 327/94, 337, 341, 327/554, 362, 552; 330/9; 333/173, 174

(56) References Cited

U.S. PATENT DOCUMENTS

| | | | | |
|---|---|---|---|---|
| 4,315,227 A | * | 2/1982 | Fleischer et al. | 333/173 |
| 4,492,935 A | * | 1/1985 | Fleischer et al. | 331/135 |
| 4,531,106 A | * | 7/1985 | Ganesan | 333/173 |
| 4,802,236 A | * | 1/1989 | Walczak et al. | 455/110 |
| 5,479,130 A | * | 12/1995 | McCartney | 327/341 |
| 6,023,191 A | * | 2/2000 | Connell et al. | 327/554 |

* cited by examiner

*Primary Examiner*—Dinh T. Le
(74) *Attorney, Agent, or Firm*—Wagner, Murabito & Hao LLP

(57) ABSTRACT

Embodiments of the present invention relate to a switched-capacitor filter which comprises a first stage which itself comprises a first switched capacitor, a second stage which itself comprises a second switched capacitor, a switched capacitive element that couples the output of the first stage to the input of the second stage, and a non-switched capacitive element coupled from the output of the second stage to the input of the first stage to provide damping of the switched-capacitor filter. Both stages are implemented as inverting analog amplifiers and the filter is especially well suited to semiconductor manufacture. The switched capacitor filter is implemented as part of a user module in a programmable system on a chip, or PSoC.

7 Claims, 4 Drawing Sheets

SWITCHED CAPACITOR FILTER

FIELD OF THE INVENTION

Embodiments of the present invention relate to the field of configurable and programmable semiconductor devices.

BACKGROUND OF THE INVENTION

Application-specific integrated circuits (ASICs), have been supplanted more and more by integrated circuits (ICs) that can be programmed to fulfill multiple functions. There are now many programmable logic architectures, including, for example, programmable logic devices ("PLDs"), programmable logic arrays ("PLAs"), complex programmable logic devices ("CPLDs"), field programmable gate arrays ("FPGAs") and programmable array logic ("PALs"). Although there are differences between these various architectures, each of the architectures typically include a set of input conductors coupled as inputs to an array of logic whose outputs, in turn, act as inputs to another portion of the logic device. Complex Programmable Logic Devices ("CPLDs") are large scale PLDs that, like many programmable architectures, are configured to the specific requirements of an application by programming.

Previously, a device was programmed once for a specific function which would be its only function for its lifetime. Each of these architectures, though, has begun to be implemented in a reprogrammable form. A programmable logic device can now be reprogrammed while in operation and can fulfill the functions of many different devices. One of the more complex reprogrammable logic devices is the programmable-system-on-chip, or PSoC™, which can be implemented as any of a number of devices, anywhere from simple logic gates to those as complex as microcontrollers.

It is noted here that this discussion of the background of the present invention uses the term "PSoC™" extensively. PSoC™ is a registered trademark of Cypress Semiconductor Corp. However, the use of the term PSoC™, each time it is used, is meant to include all forms of complex programmable logic device (PLD) architectures, including programmable logic array (PLA), complex programmable logic device (CPLD), field programmable gate arrays (FPGA) and programmable array logic (PAL).

One of the more demanding applications of PSoC™ programmable controller configuration is in the field of Digital Signal Processing, or DSP. The interface required between the outside "real" world and the DSP world includes analog-to-digital and digital-to-analog conversion (ADC and DAC, respectively). Additionally, it often also requires analog amplification and filtering. To reduce cost and increase functionality, it is desirable to combine analog circuitry with DSP in the same chip.

Complex device configurations require the establishment of numerous connections between functional blocks or user modules within the programmable device. User modules are the building blocks of an end configuration. User modules are implemented in hardware when the device is manufactured and, depending on the user's desired device function, combine in interconnection to achieve the various functions required.

Achievable functions are limited by the capabilities of the hardware resources in the user module blocks. When a desired function requires signal processing, signal filtering is required and must be an available hardware function implemented in the programmable device. Switched-capacitor filters are one way of implementing filtering in a semiconductor device. However, to achieve the high-gain filtering required for some signal processing, very complex structures have been required that absorb large parts of semiconductor "real estate" and force manufacturing costs to be high. This demand reduces the real estate available for other functional user modules, limiting the total capabilities of a semiconductor device.

Another limitation found in signal filtering is the available die area and the power required for high speed operation. In even the best existing designs, filtering accuracy and gain come at the cost of decreasing speed and increasing complexity.

A need exists therefore, for a switched-capacitor filter that can improve and streamline signal processing functions in highly complex programmable devices such as PSoCs. Such a switched-capacitor filter must be able to be incorporated in user-configurable functional user module blocks in a PSoC™ programmable controller and must enable configurations of the PSoC™ programmable controller to include efficient DSP functions. Furthermore, such a switched-capacitor filter must be able to be manufactured in known semiconductor manufacturing processes.

SUMMARY OF THE INVENTION

Disclosed herein is a switched-capacitor filter for improving and streamlining the analog signal processing functions in of highly complex programmable devices such as PSoCs. The switched-capacitor filter is incorporated in the user-configurable functional user module blocks in a PSoC™ programmable controller and enables configurations of the PSoC™ programmable controller to combine analog signal processing with efficient DSP functions and enable both to be efficiently manufactured in known semiconductor manufacturing processes.

Embodiments of the present invention relate to a switched-capacitor filter which comprises a first stage which itself comprises a first switched capacitor, a second stage which itself comprises a second switched capacitor, a switched capacitive element that couples the output of the first stage to the input of the second stage, and a non-switched capacitive element coupled from the output of the second stage to the input of the first stage to provide damping of the switched-capacitor filter. Both stages are implemented as inverting analog amplifiers and the filter is especially well suited to semiconductor manufacture. The switched capacitor filter is implemented as part of a user module in a programmable system on a chip, or PSoC.

These and other objects and advantages of the present invention will become obvious to those of ordinary skill in the art after having read the following detailed description of the preferred embodiments which are illustrated in the various drawing figures.

BRIEF DESCRIPTION OF THE DRAWINGS

The operation and components of this invention can be best visualized by reference to the drawings.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it should be understood by one of ordinary skill in the art that the present invention may be practiced without these specific details. In other instances, well-known methods, procedures, components, and circuits have not been described in detail so as not to unnecessarily obscure aspects of the present invention. At times, concepts disclosed in this discussion of embodiments of the present invention will be made more readily apparent by reference to the Figures. This discussion of embodiments of the present invention is meant to be read in light of the disclosure of a configuration tool that is incorporated herein by reference to patent application U.S. Ser. No. 09/989,570 entitled "METHOD FOR FACILITATING MICROCONTROLLER PROGRAMMING," filed Nov. 19, 2001 and assigned to the assignee of the present invention.

It is noted here that this discussion of embodiments of the present invention uses the term "PSoC™" extensively. PSoC™ is a registered trademark of Cypress Semiconductor Corp. However, the use of the term PSoC™ is meant to include all forms of complex programmable logic device (PLD) architectures, including programmable logic array (PLA), complex programmable logic device (CPLD), field programmable gate arrays (FPGA) and programmable array logic (PAL) or any other form of programmable logic device. Embodiments of the present invention can be implemented in any programmable logic device in which analog signals are processed or in which analog/digital hybrid circuitry is provided.

Figure 1:
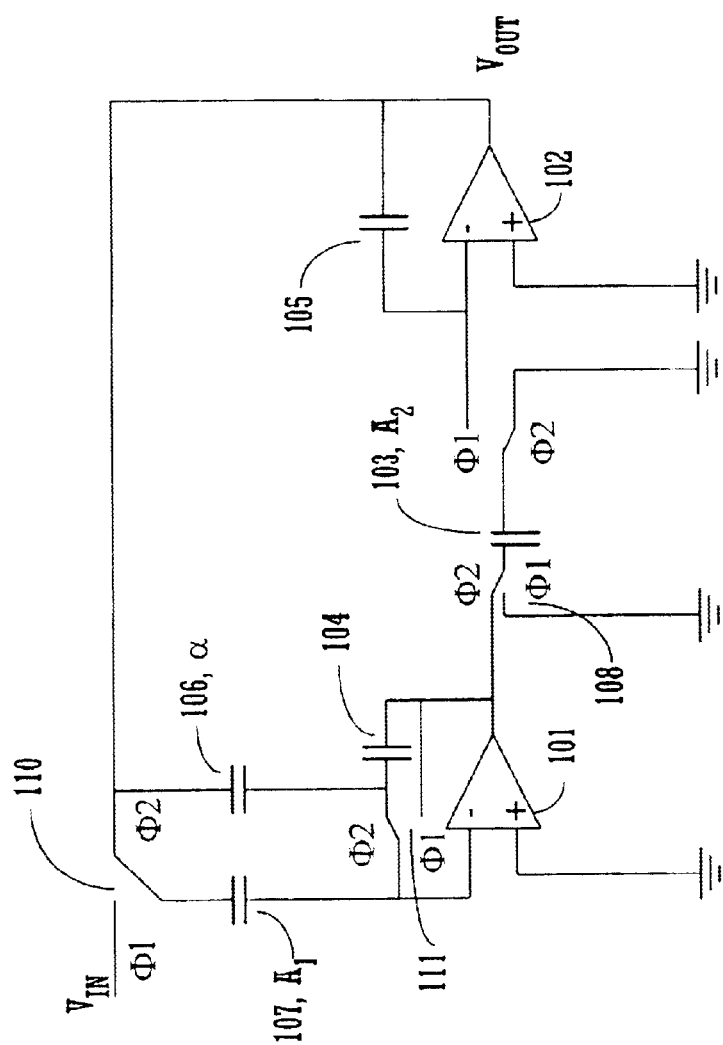
FIG. 1 illustrates a switched capacitor filter circuit in accordance with one embodiment of the present invention.

FIG. 1 illustrates one embodiment of the present invention, a high accuracy switched capacitor filter, or Biquad, which is comprised of a cascade of two integrators. The first integrator, amplifier 101 and capacitor 104, is auto-zeroed by the action of switch 111 during auto-zero phase φ1, and its output is near zero for any steady state DC input. In this embodiment, this first stage integrator uses non-switched capacitor 106, of some value α, to set the reciprocal damping factor, or Q. Because capacitor 106 is a non-switched capacitor, it does not detract from the DC gain of either integrator stage and replaces the single pole second stage response used for damping in some existing filters. The gain and offset of the first stage are thus both corrected by auto-zeroing.

The output of first stage amplifier 101 is connected to the input of second stage amplifier 102 via switched second stage capacitor 103 which is switched by the action of switches 108 and 109 which alternatively reference the capacitor plates to ground. The second integrator, comprising amplifier 102 and capacitor 105, is undamped so its input is nominally zero for any DC steady state output, and implies that the output of the first integrator is near zero. This initiates the auto-zero and output valid times (φ1 and φ2 respectively) of the first integrator. Both the offset and finite gain of first stage amplifier 101 are corrected through auto-zeroing. Since the output of first stage amplifier 101 is always near zero (for low frequency inputs) its function does not need to slew during the auto-zeroing condition (or from the auto-zero condition to the output valid condition). This allows high-speed operation of the first stage amplifier since no large signal settling, and less small signal settling (ideally none for a DC input), is required.

The circuit of this embodiment of the present invention implements damping with non-switched first stage input capacitor 107 between the output of second stage amplifier 102 and the input of first stage amplifier 101 so as to not detract from the DC gain of either stage of the circuit. By not implementing damping in the second stage, high DC gain in the second stage is possible, which is required to keep the output of the first integrator near zero. As implemented in this embodiment, the auto-zeroing of first stage amplifier 101 improves its effective gain to switched capacitor 103 since the output conditions are very nearly identical during auto-zero and non-auto-zero phases. This allows the circuit of the present embodiment to be effective with lower gain amplifier structures, which can be made to operate much faster, using lower power and requiring less of the semiconductor real estate.

The S domain approximation of the transfer function of this embodiment of the present invention shown in FIG. 1 is written in as:

$$\frac{V_{OUT}}{V_{IN}} = \frac{1}{(S^2/C_{107}C_{103}) + (aS/C_{103}) + 1}$$

where "a" is the capacitance value of damping capacitor 106, $C_{103}$ is the capacitance value of switched second stage input capacitor 103 and $C_{107}$ is the capacitance value of first stage input capacitor 107.

Figure 2:
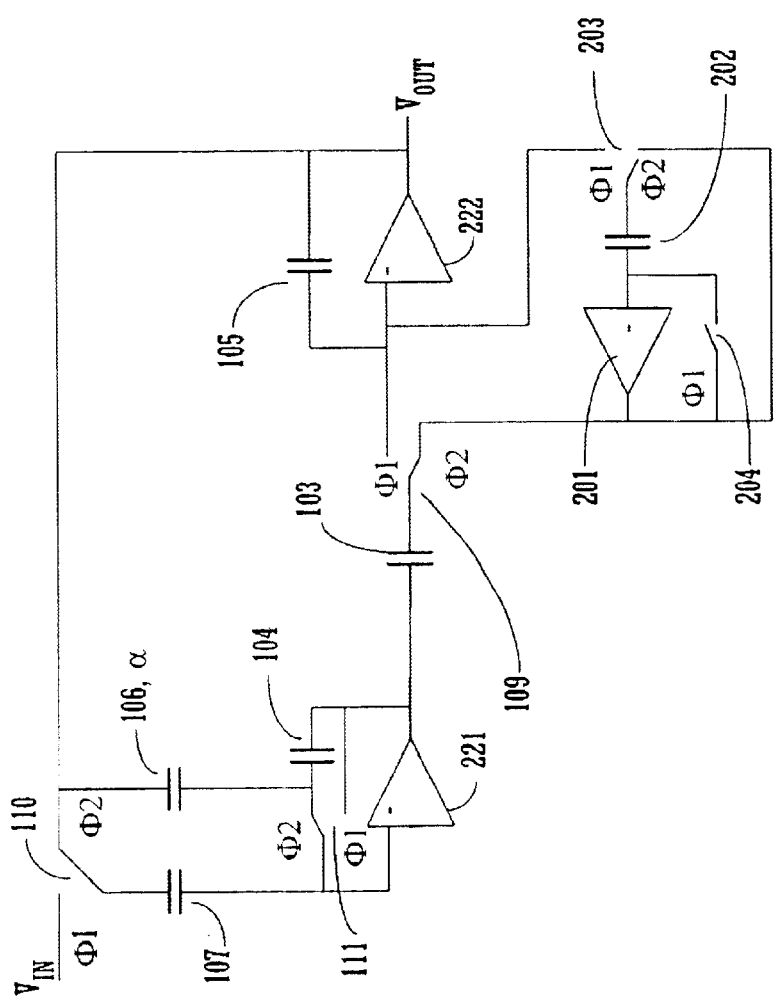
FIG. 2 illustrates a switched capacitor filter circuit in accordance with one embodiment of the present invention.

Another embodiment of the present invention is illustrated in FIG. 2. This embodiment includes a low-glitch circuit which is implemented in amplifier 201, capacitor 202, switch 203 and auto-zero switch 204, at the input to second stage amplifier 102. This embodiment only switches the output of second stage input capacitor 103. The low glitch circuit enhancement serves to balance any transition glitch of the first stage integrator during auto-zero/output transition. The transfer function of this embodiment of the present invention, illustrated in FIG. 2, is identical to that of the embodiment illustrated in FIG. 1.

Figure 3:
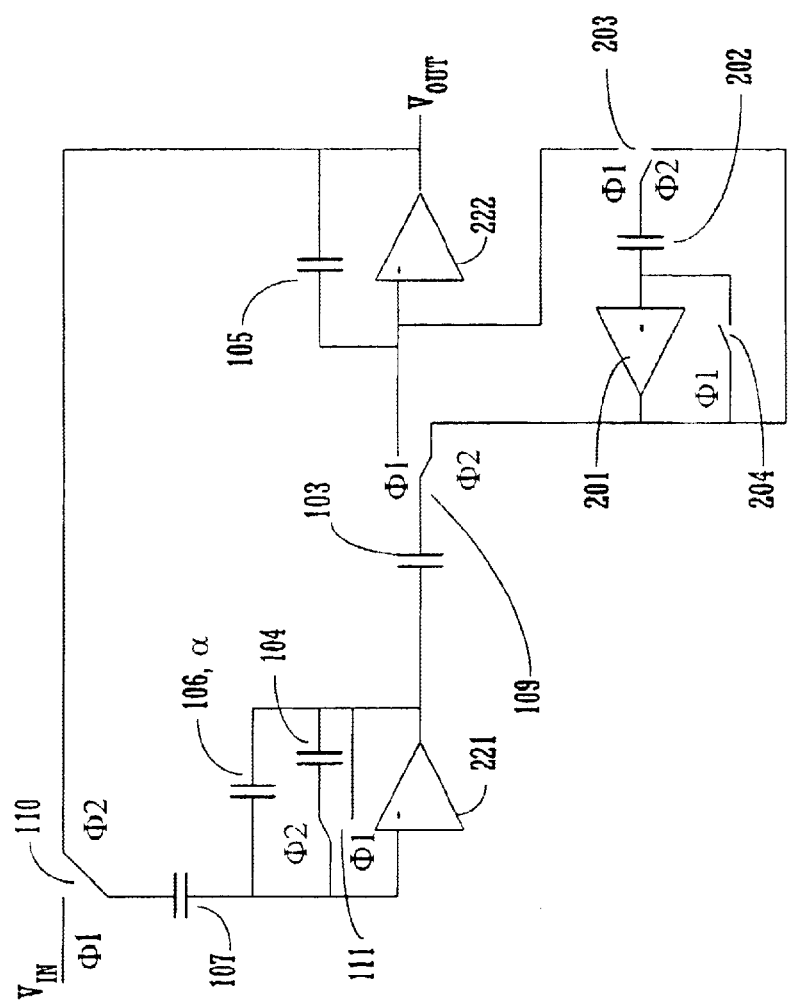
FIG. 3 illustrates a switched capacitor filter circuit in accordance with one embodiment of the present invention.
Figure 4:
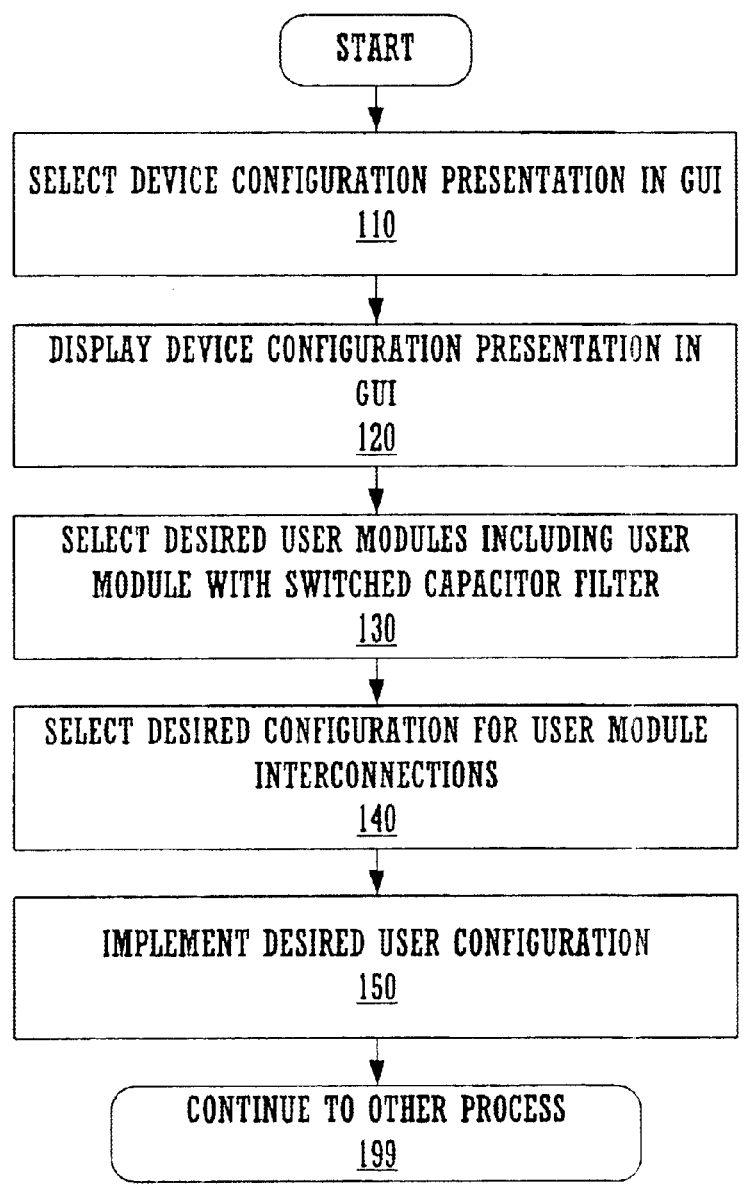
FIG. 4 illustrates a method for selecting and configuring a functional switched capacitor filter user module in a graphical user interface (GUI) in accordance with one embodiment of the present invention.

An additional feature of the embodiment illustrated in FIGS. 2 and 3 is the exclusive use of analog inverting amplifiers as shown at 201, 221 and 222. The result of this use in these embodiments is a further reduction in semiconductor structural requirements; that is, an even smaller semiconductor real estate footprint.

It is noted that the circuits described above can be implemented in fully differential form, normally enabled by inclusion of a common mode feedback circuit. The single-ended circuit is shown for illustration but this is not meant to preclude coverage of differential forms.

Yet another embodiment of the present invention is shown in FIG. 3. This embodiment eliminates non-switched coupling between the biquad low pass output and the input of first stage amplifier 221. Damping capacitor 106 is implemented as an unswitched integrating capacitor in this implementation, resulting in even less glitching being provided to the output. Furthermore, less capacitance is required to achieve the damping term ($\alpha/C_{107}C_{103}$), compared with ($\alpha/C_{103}$), since $C_{107}$ has a value less than unity. These enhancements allow this embodiment to consume less area, and also allow the switched capacitor filter circuit to respond more quickly without drawing excessive drive power from the op-amps, since less energy is stored in the damping capacitor. Such an enhancement helps reduce glitching.

The S domain transfer function of the embodiment of the present invention shown in FIG. 3 is written in as:

$$\frac{V_{OUT}}{V_{IN}} = \frac{1}{(S^2/C_{107}C_{103}) + (\alpha S/C_{107}C_{103}) + 1}$$

where, again, "$\alpha$" is the capacitance value of damping capacitor 106, $C_{103}$ is the capacitance value of switched second stage input capacitor 103 and $C_{107}$ is the capacitance value of first stage input capacitor 107.

The switched capacitor filter implemented in these embodiments of the present invention is ideally suited to incorporation in analog blocks of PSoC™ programmable controller architecture. In one embodiment, for example, it is used to implement a DAC output. In another embodiment, it is used as a simple and compact switched capacitor filter block. Embodiments of the present invention have more general application, as well.

These embodiments of the present invention allow the use of simpler analog structures when implemented in semiconductor devices, such as a PSoC™ programmable controller, while still providing sufficiently high gain for an amplifier. Thus, each embodiment requires smaller size and less power than previous filters. Therefore, each PSoC™ programmable controller user module in which an embodiment of the present invention is incorporated can be made smaller than previously, allowing more functional user modules to be incorporated in the PSoC™.

The present invention can operate at fairly high speed and low power. Speed improvement implies a power improvement because power may be traded for speed. It may have improved DC accuracy for a given gain in the basic amplifiers.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

We claim:

1. A switched-capacitor filter, comprising:

a first integrator having an input selectively couplable to an input of said switched-capacitor filter;

an auto-zeroing element for selectively connecting an output of said first integrator to an input of said first integrator during an auto-zero state;

a second integrator having an output coupled to an output of said switched-capacitor filter;

a switched capacitive element coupled between said output of said first integrator and an input of said second integrator;

a non-switched capacitive element coupled between said output of said second integrator and said input of said first integrator to provide damping of said switched-capacitor filter; and a low-glitch circuit selectively couplable to said input of said second integrator.

2. The switched-capacitor filter described in claim 1, wherein said first integrator comprises a first inverting analog amplifier.

3. The switched-capacitor filter described in claim 2, wherein said second integrator comprises a second inverting analog amplifier.

4. The switched-capacitor filter described in claim 2 wherein a gain of said first inverting analog amplifier is corrected by said auto zeroing element.

5. The switched-capacitor filter described in claim 1, wherein said low-glitch circuit comprises:

an inverting analog amplifier; and a switched capacitor coupled to the input of said inverting analog amplifier.

6. The switched-capacitor filter described in claim 5 wherein said low-glitch circuit further comprises a second auto-zeroing element for selectively connecting an output of said inverting analog amplifier to an input of said inverting analog amplifier during an auto-zero state.

7. The switched-capacitor filter described in claim 2, wherein an offset of said first inverting analog amplifier is corrected by said auto zeroing element.

* * * * *